United States Patent
Hennig

(10) Patent No.: US 6,850,063 B2
(45) Date of Patent: Feb. 1, 2005

(54) METHOD FOR MEASURING THE MAGNETIC RESONANCE (NMR) BY MEANS OF SPIN ECHOES

(75) Inventor: Jürgen Hennig, Freiburg (DE)

(73) Assignee: Universitatsklinikum Freiburg (DE)

( * ) Notice: Subject to any disclaimer, the term of this patent is extended or adjusted under 35 U.S.C. 154(b) by 0 days.

(21) Appl. No.: 10/303,336

(22) Filed: Nov. 25, 2002

(65) Prior Publication Data

US 2003/0112008 A1 Jun. 19, 2003

(30) Foreign Application Priority Data

Nov. 29, 2001 (DE) .......................................... 101 58 531

(51) Int. Cl.$^7$ ................................................. G01V 3/00
(52) U.S. Cl. ...................... 324/314; 324/309; 324/307
(58) Field of Search ................................ 324/307, 308, 324/309, 314

(56) References Cited

U.S. PATENT DOCUMENTS

| 6,404,195 | B1 | * | 6/2002 | Deimling ..................... 324/308 |
| 6,456,071 | B1 | * | 9/2002 | Hennig ........................ 324/307 |
| 6,677,750 | B2 | * | 1/2004 | Hennig et al. ............... 324/307 |
| 6,700,375 | B2 | * | 3/2004 | Machida et al. ............ 324/314 |
| 2001/0006345 | A1 | * | 7/2001 | Machida et al. ............ 324/314 |
| 2002/0021127 | A1 | * | 2/2002 | Hennig ........................ 324/307 |
| 2002/0167318 | A1 | * | 11/2002 | Hennig ........................ 324/307 |
| 2003/0112008 | A1 | * | 6/2003 | Hennig ........................ 324/314 |

FOREIGN PATENT DOCUMENTS

| DE | 199 31 292 A1 | 2/2001 |
| EP | 1 241 484 A | 9/2002 |

OTHER PUBLICATIONS

Hennig J et al: "Multiecho sequences with variable refocusing flip angles: optimization of signal behaviour using smooth transitions between pseudo steady states (TRAPS)" Magnetic Resonance in Medicine, Mar. 2003, Wiley, USA, vol. 49, No. 3, pp. 527–535, XP002272892 ISSN: 0740–3194 see the whole document.

J. Hennig et al: "Multiecho Sequences with Variable Refocusing Flip Angles: Optimization of Signal Behaviour Using Smooth Transitions between Pseudo Steady States (TRAPS)" Proc. Intl. Soc. Mag.Reson.Med. 10 (2002), p. 2356 XP002272893 published conference paper.

(List continued on next page.)

*Primary Examiner*—Diego Gutierrez
*Assistant Examiner*—Tiffany A. Fetzner
(74) *Attorney, Agent, or Firm*—Walter & Hackler

(57) ABSTRACT

A nuclear magnetic resonance (NMR) spectroscopy or tomography method wherein a sequence of temporally mutually offset radio frequency (RF) pulses is applied onto a spin ensemble like a CPMG multi echo experiment, and wherein the magnetization produced after an initial excitation pulse is transferred to or close to the static pseudo steady state of the initially applied refocussing flip angle $\alpha 1$ is characterized in that magnetization is transferred through gradual change of the refocussing flip angle in subsequent refocussing intervals to or close to the static pseudo steady state of the respectively used refocussing pulse with refocussing flip angle $\alpha_n$ such that the echo amplitude of the nth echo generated in this fashion approaches the maximum possible value corresponding to the respective refocussing pulse with refocussing flip angle $\alpha_n$. The RF energy required for excitation of the nuclear spins can thereby be considerably reduced without having to accept signal intensity losses.

9 Claims, 14 Drawing Sheets

OTHER PUBLICATIONS

Alsop D C: "The Sensitivity of Low Flip Angle Rare Imaging" Magnetic Resonance in Medicine, Academic Press, Duluth, MN, US, vol. 37, No. 2, Feb. 1, 1997, pp. 176–184, XP000678712 ISSN: 0740–3194 see chapters 'Optimization of Echo Amplitudes' and 'Discussion'.

E.L. Hahn, "Spin Echoes", Physical Review, Nov. 15, 1989, pp. 580–594, vol. 80, No. 4.

S. Meibomm and D. Gill, "Modified Spin–Echo Method for Measuring Nuclear Relaxation Times" The Review of Scientific Instruments, Aug. 1958, pp. 688–691, vol. 29, No. 8.

J. Hennig, "Multiecho Imaging Sequences With Low Refocusing Flip Angles", Journal of Magnetic Resonance, 1988, pp. 397–407, vol. 78, Academic Press, Inc.

Jurgen Hennig and Klaus Scheffler, "Easy Improvement of Signal–to–Noise in Rare Sequences With Low Refocusing Flip Angles", Magnetic Resonance in Medicine, pp. 983–985, vol. 44, 2000, Wiley–Liss, Inc.

Patrick Le Roux and R. Scott Hinks, "Stabalization of Echo Amplitudes in FSE Sequences", MRM, 1993, pp. 183–191, vol. 30, Williams & Wilkins.

David C. Alsop, "The Sensitivity of Low Flip Angle Rare Imaging", MRM, 1997, pp. 176–184, vol. 37, Williams & Wilkins.

Jurgen Hennig, "Echoes—How to Generate, Recognize, Use or Avoid Them in MR–Imaging Sequences, Part I: Fundamental and not so Fundamental Properties of Spin Echoes", Concepts in Magnetic Resonance, 1991, pp. 125–143, V.3.

Jurgen Hennig and Claus Scheffler, "Hyperechoes", Magnetic Resonance in Medicine, 2001, pp. 6–12, vol. 46, Wiley–Liss, Inc.

C.M.J. Van Uijen and J.H. Den Boef, "Driven–Equilibrium Radiofrequency Pulses in NMR Imaging", Magnetic Resonance in Medicine, 1984, pp. 502–507, vol. 1, Academic Press, Inc.

* cited by examiner

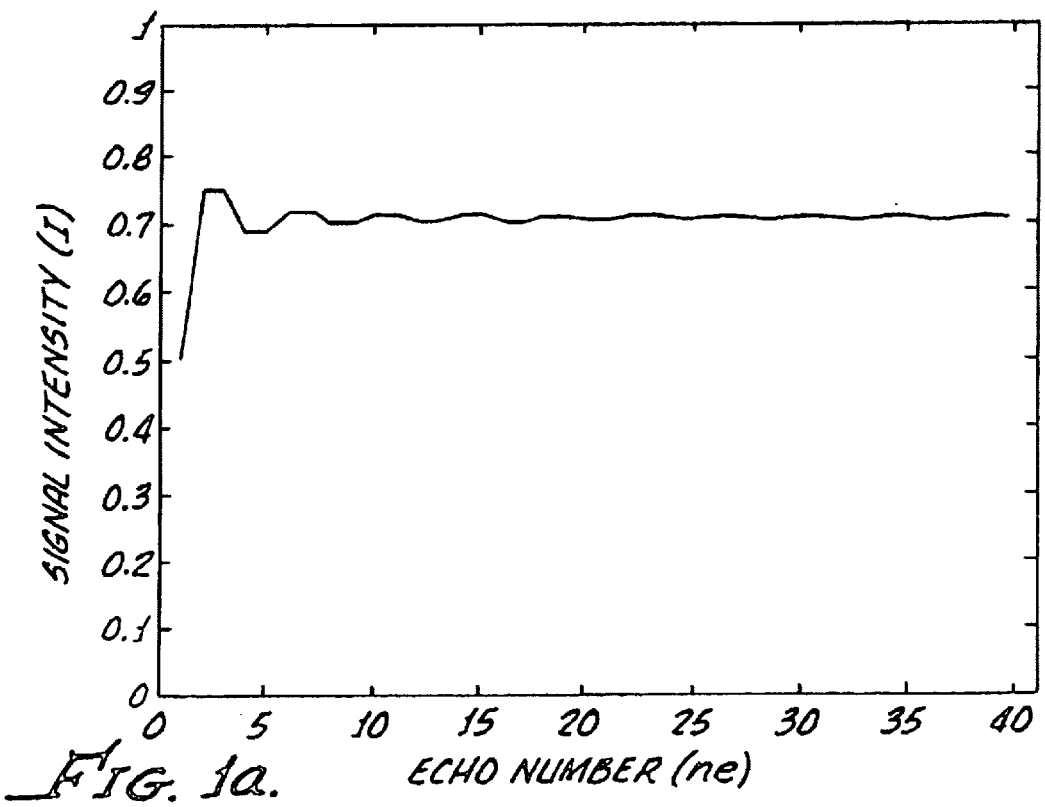
_FIG. 1a._
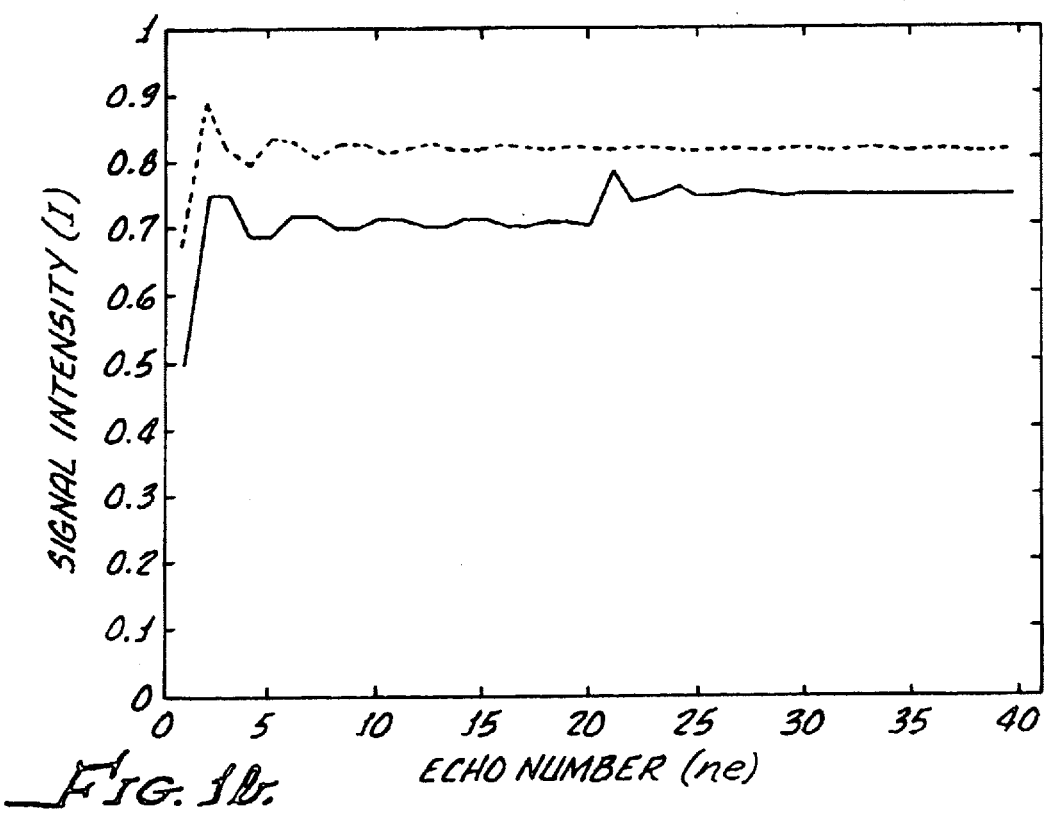
_FIG. 1b._

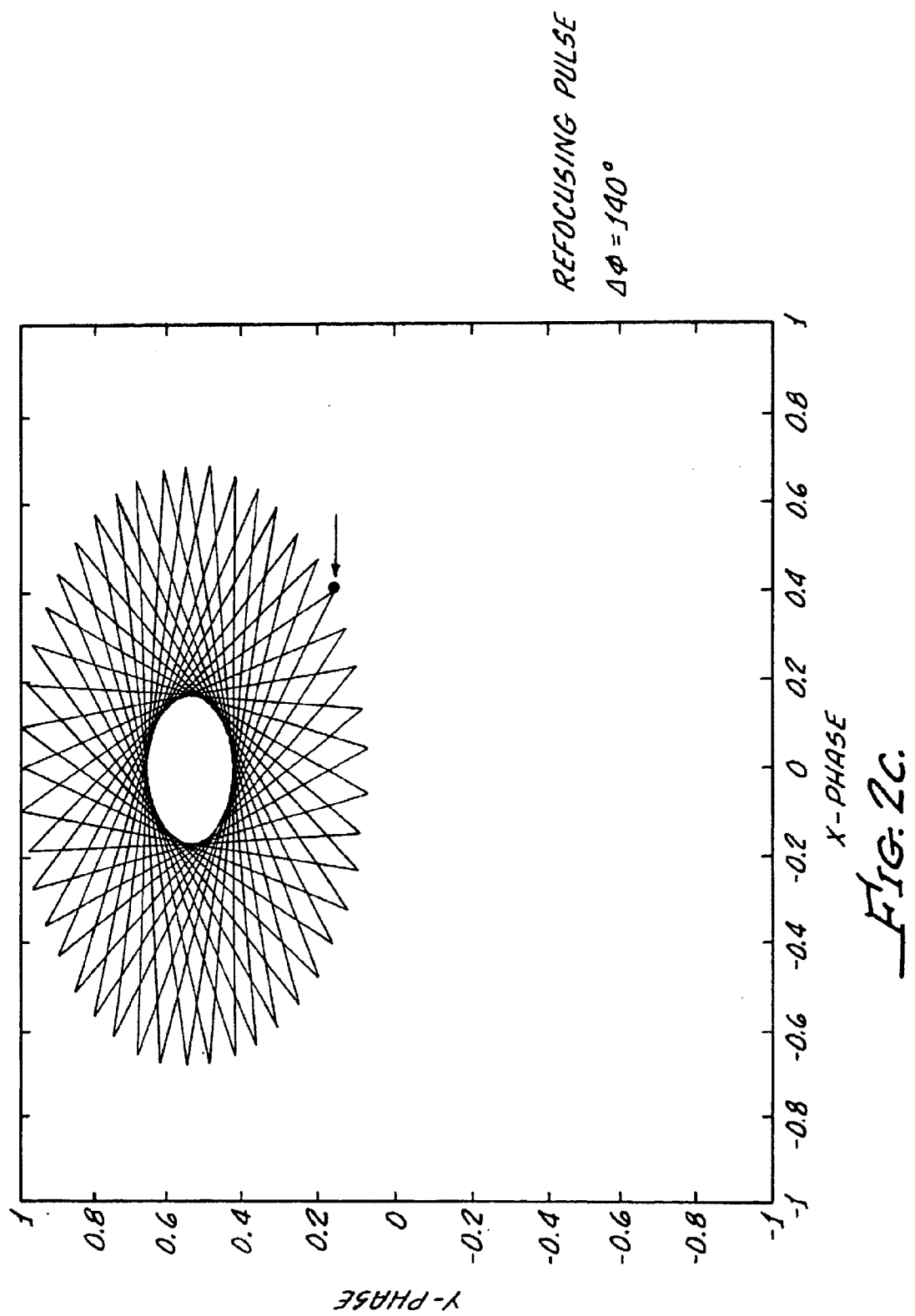

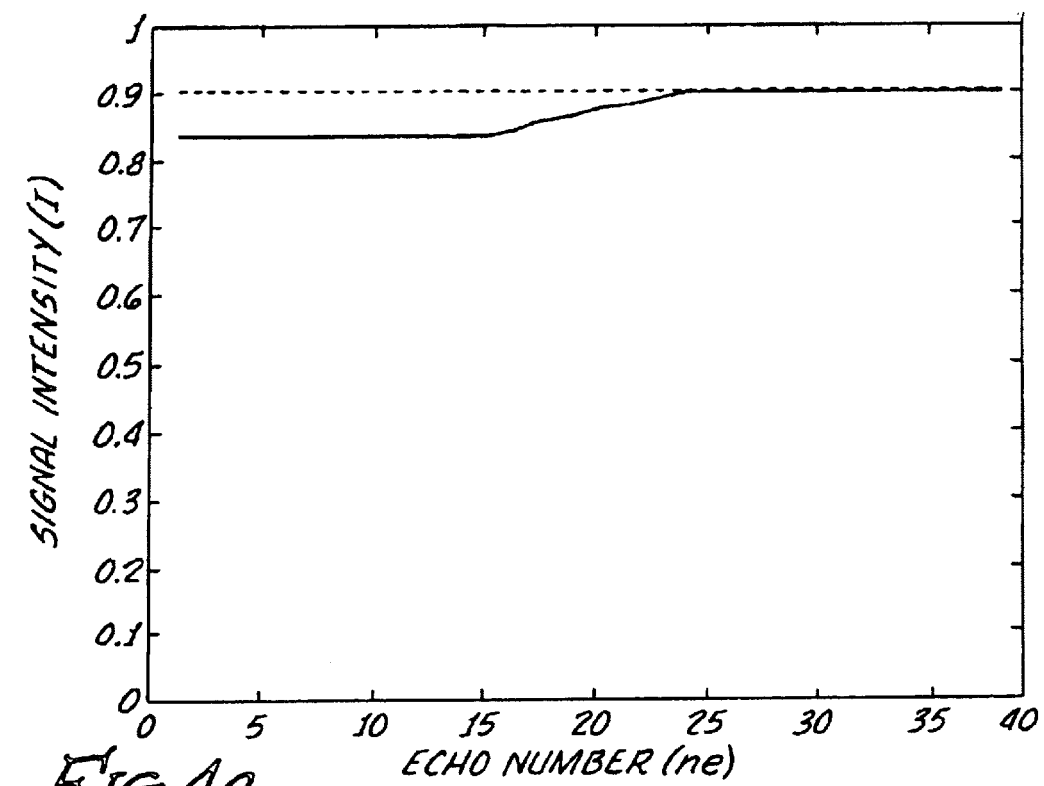
_FIG. 4a._
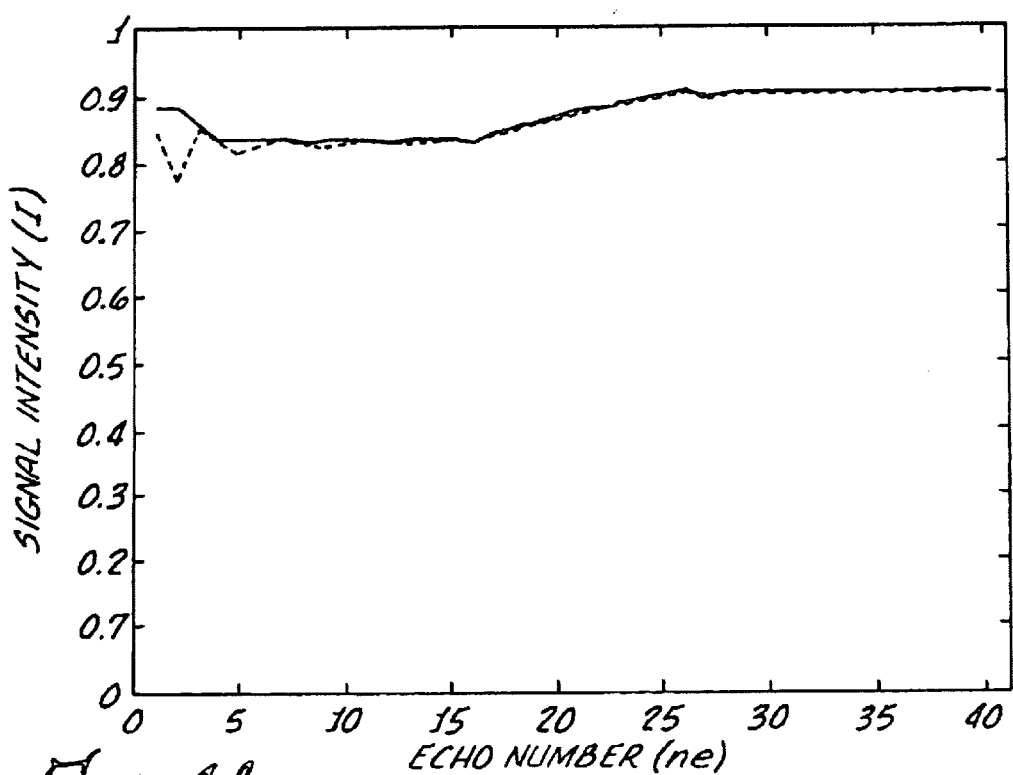
_FIG. 4b._

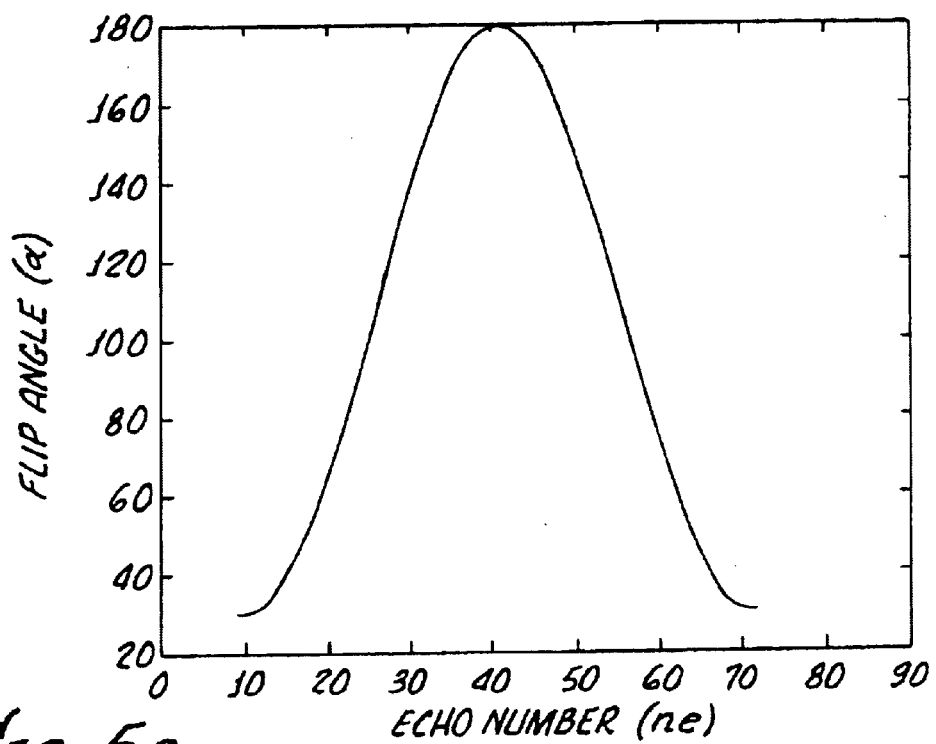
_Fig. 5a._
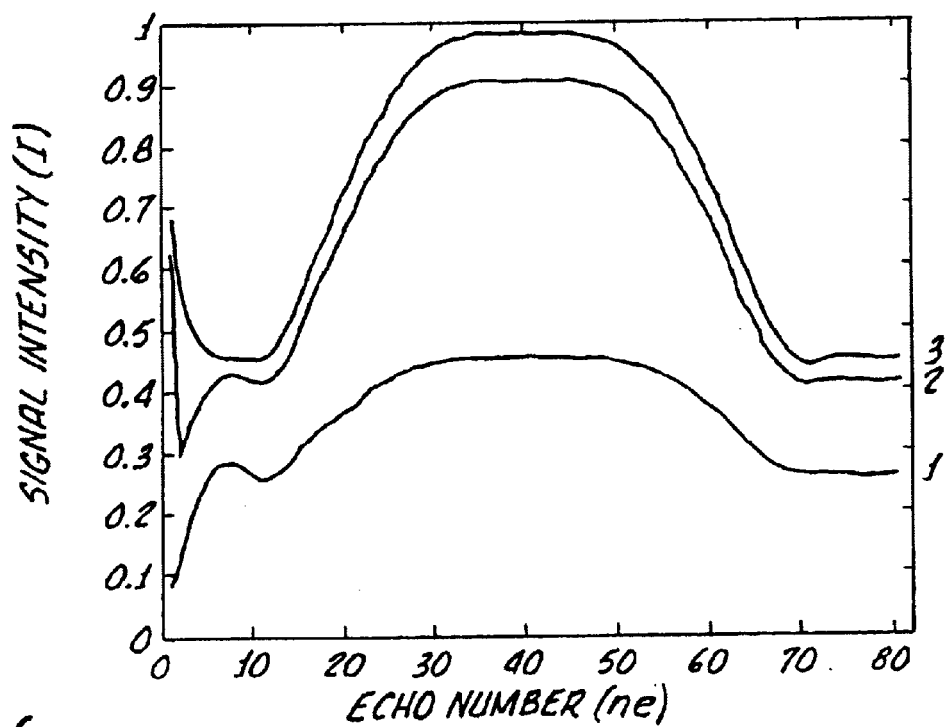
_Fig. 5b._

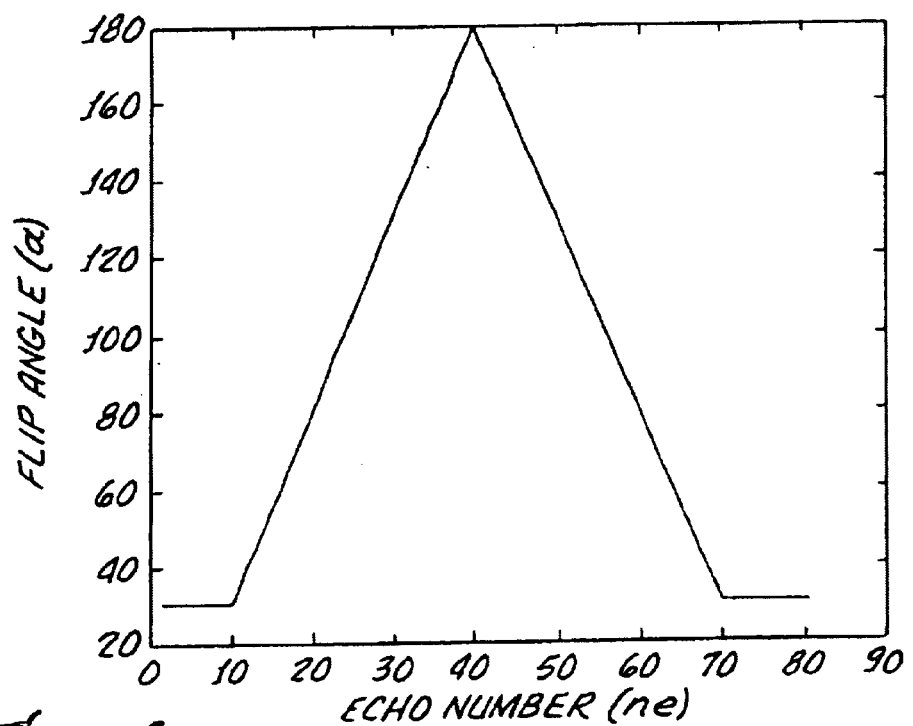
_FIG. 6a._
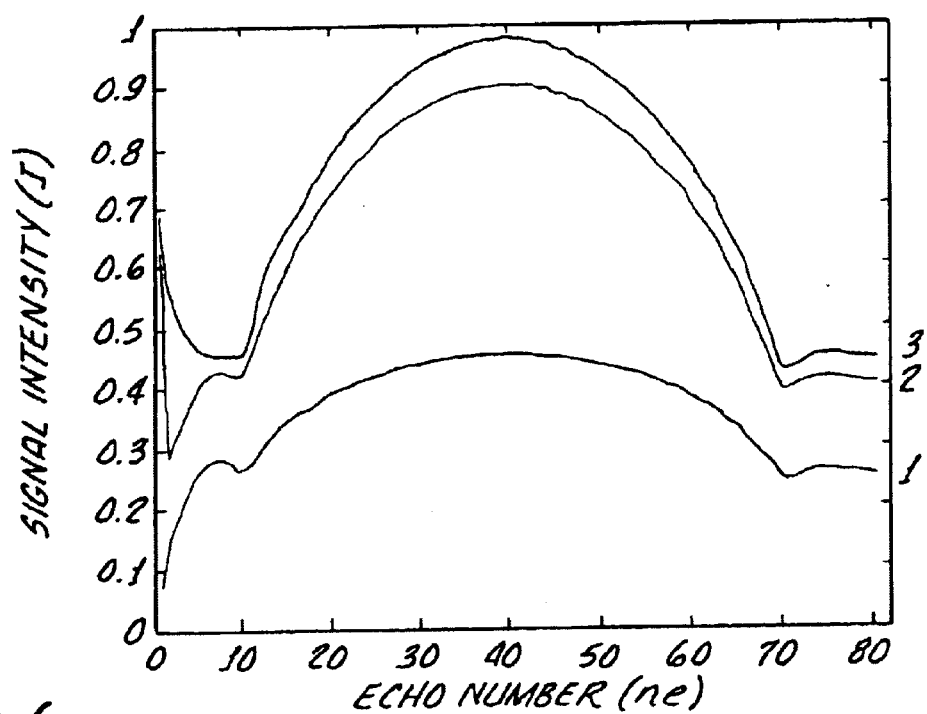
_FIG. 6b._

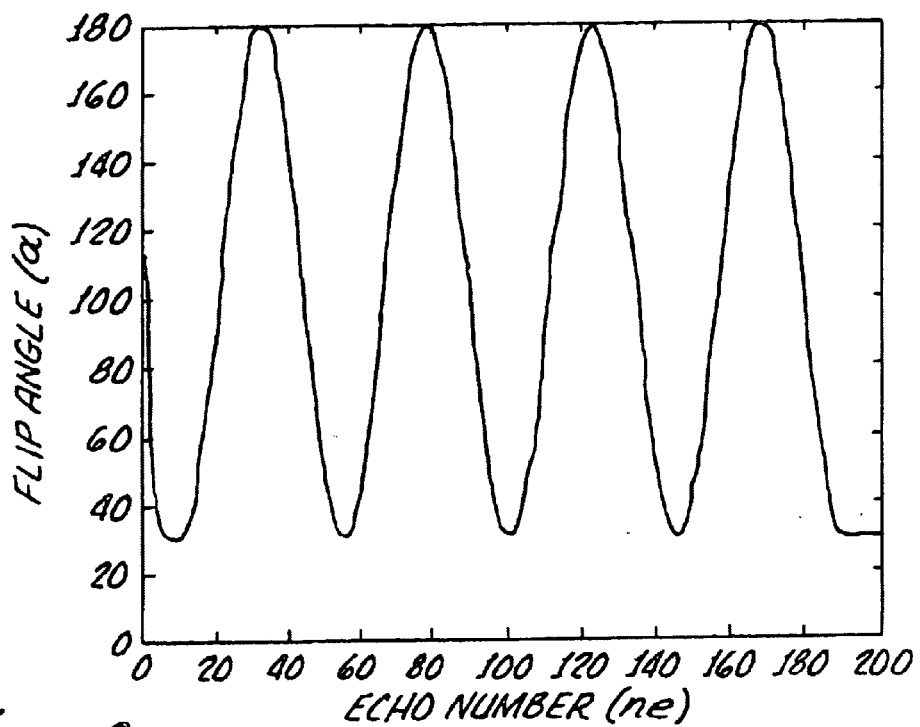
_Fig. 9a._
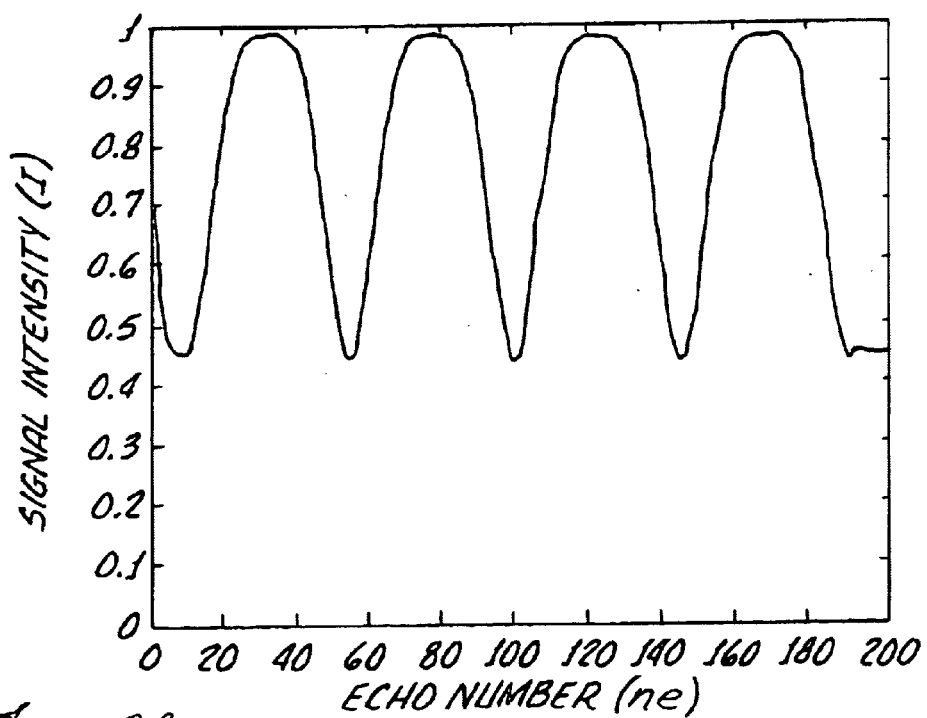
_Fig. 9b._

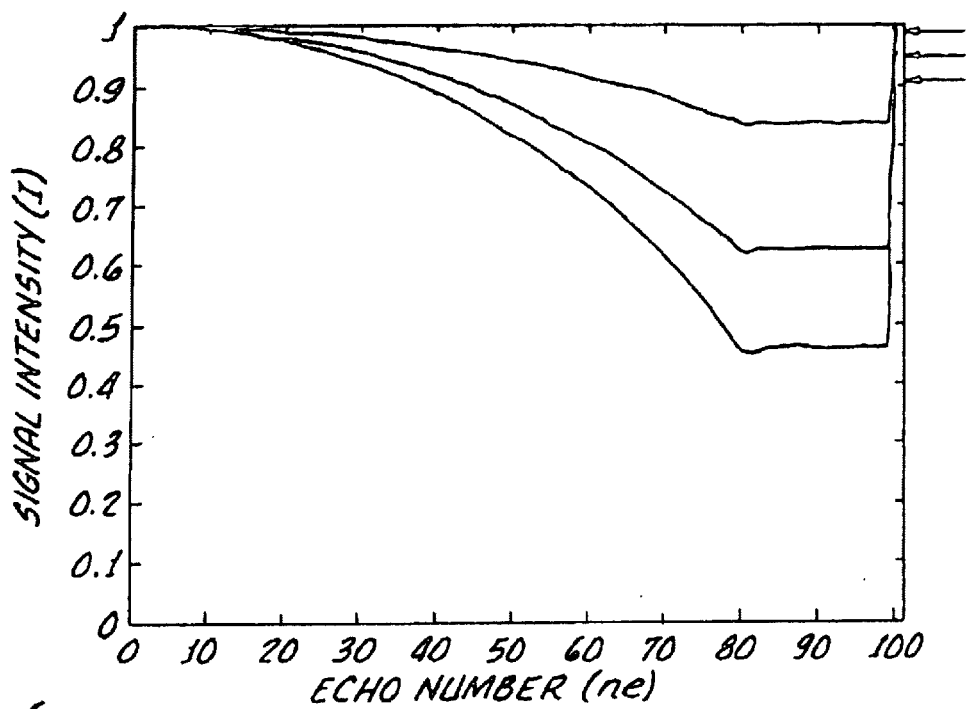
_FIG. 11._
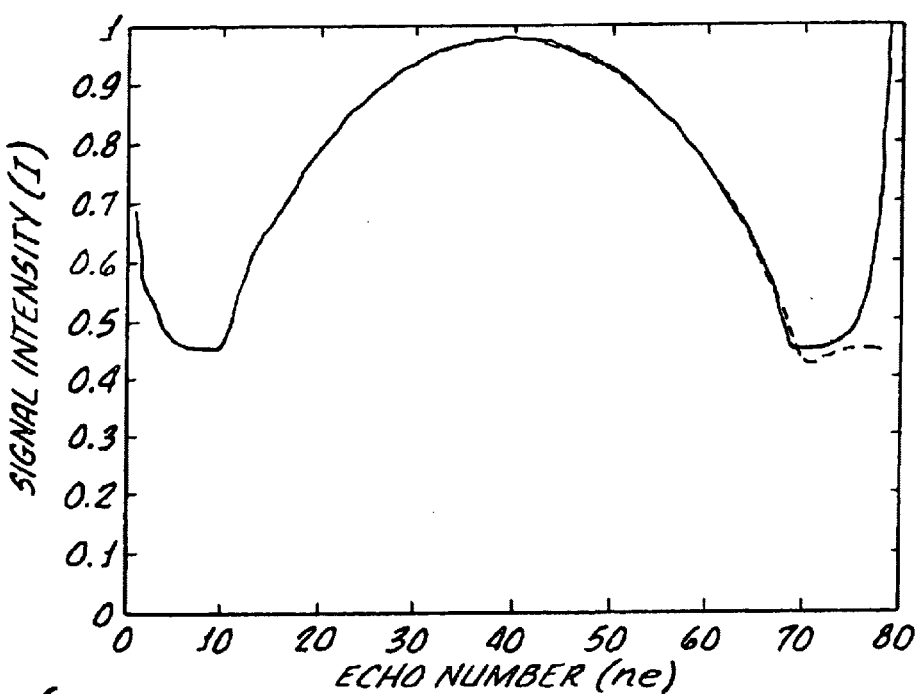
_FIG. 12._

METHOD FOR MEASURING THE MAGNETIC RESONANCE (NMR) BY MEANS OF SPIN ECHOES

This application claims Paris Convention priority of DE 101 58 531.4 filed 29 Nov. 2001 the complete disclosure of which is hereby incorporated by reference.

BACKGROUND OF THE INVENTION

The invention concerns a method of nuclear magnetic resonance (NMR) spectroscopy or tomography, wherein a sequence of radio frequency (RF) pulses consisting of an excitation pulse followed by a sequence of in general equidistant refocusing pulses is applied to a spin ensemble like in a CPMG multi echo experiment, and wherein the magnetization generated after an initial excitation pulse is transferred to or close to the static pseudo steady state of some refocusing flip angle $\alpha_1$ and kept in or close to the static pseudo steady state of any ensuing refocusing pulse $\alpha_n$.

The basic spin echo refocusing experiment is known from Hahn E L, Spin Echoes, Phys. Rev. 80:580–594 (1950) (=Reference [1]).

Nuclear resonance signals are often measured through the spin echo method [1]. Therein, the excited magnetization is inverted after a period te/2 through a refocusing pulse, and after a further period te/2, a spin echo is formed. At the time of the spin echo, effects acting on the spins such as chemical shift, susceptibility, field inhomogeneity are refocused such that all spins have a coherent signal phase with respect to these effects.

The signal maximum is obtained when the flip angle of the refocusing pulse is exactly 180°. Such an ideal flip angle can only be approximated in practice such that in particular for methods which are based on formation of many spin echoes, signal losses result on the basis of the deviation of the flip angle of the refocusing pulses of 180°. Such a deviation can occur either through technical facts or on purpose, e.g. In applications on human beings to stay within the allowed values for radio frequency exposure measured by the SAR (=specific absorption rate).

Literature suggested a series of measures for limiting the corresponding signal losses. This is on the one hand the so-called Carr-Purrcell-Meiboom-Gill method [2] wherein the refocusing pulses are partially automatically compensated for through corresponding signal phase shift between excitation and refocusing pulses.

It was shown that with such a sequence and long echo trains, high echo amplitudes can be obtained even with small refocusing flip angles [3].

The use of one [4] or more [5,6] different optimized flip angles over the first refocusing periods of the multi echo train further increases the echo amplitude.

All of these methods are based on the fact that magnetization is transferred into a so-called pseudo steady state through application of a sequence of equidistance pulses $P(\alpha\phi)$ with identical amplitude $\alpha$ and phase $\phi$ where it could be shown [7] that for any $\alpha,\phi$, an infinite variety of such pseudo steady states exists. The term pseudo steady state originates from the fact that a constant signal amplitude can be achieved only when relaxation effects are neglected.

The modifications described in references [4]–[6] therefore have the aim to bring magnetization as close as possible to the one particular pseudo steady state with maximum amplitude, which is called the static pseudo steady state, which in the following is designated as PSS0. In addition to maximation of the signal intensity, the signal modulations which occur during use of continuously constant flip angles, are eliminated.

The common feature of all these methods is therefore to transfer the purely coherent magnetization M(x,y), generated by the initial excitation pulse, as continuously as possible to or at least close to PSS0 and keep PSS0 through further application of pulses with constant $\alpha,\phi$.

SUMMARY OF THE INVENTION

In contrast thereto, it is the object of the present invention to further improve a method of the above-described type such that the overall RF energy over the echo train is considerably reduced.

This object is achieved in accordance with the invention in a surprisingly simple and also effective fashion in that after reaching the initial PSS0 with respect to some refocusing flip angle $\alpha_1$ magnetization is transferred through gradual change of the refocusing flip angle in subsequent refocusing intervals to or close to the static pseudo steady state of the respectively used refocusing pulse with refocusing flip angle $\alpha_n$ such that the echo amplitude of the nth echo, generated in this fashion, approaches the maximum possible value corresponding to the respective refocusing pulse with refocusing flip angle $\alpha_n$.

The inventive method is based on the surprising finding that the magnetization which has been transferred once into PSS0 has a highly robust behavior with respect to changes of $\alpha,\phi$ and can be transferred in particular easily from one PSS0 ($\alpha 1,\phi 1$) to another PSS0 ($\alpha 2,\phi 2$) with different flip angle and phase. The inventive modulations of the refocusing pulses while staying in or close to PSS0 ($\alpha n,\phi n$) which belongs to the respective pulse $P(\alpha n,\phi n)$ is designated as the TRAPS (transient pseudo steady state) method below. TRAPS can be used for a plurality of applications, mainly for the reduction of the radio frequency load with long echo trains.

For this purpose of use, TRAPS is complementary to the so-called hyper echo method [8] wherein the full magnetization is obtained through corresponding symmetrization of the sequence about a central refocusing pulse with a 180° flip angle. In contrast to TRAPS, the hyperecho mechanism does not require a transition into PSS0 but rather transfers magnetization back into the original coherent magnetization through by observing symmetry relations with respect to a 180° pulse place centrally in the echo train according to the hyper echo mechanism. TRAPS does not require such a central 180° pulse, but relies on keeping magnetization in or close to PSS0. Both techniques are therefore complementary and can be reasonably combined for a series of preferred applications.

One variant of the inventive method is particularly preferred wherein the multi echo sequence is used as a NMR imaging method according to the RARE method (which is also called TSE=turbo spin echo or FSE=fast spin echo by different manufacturers), in which each echo in the echotrain is spatially encoded through use of temporally variable magnetic field gradients.

The multi echo generation is likely to become a main field of application of the inventive method since the advantages of the invention have particular effect therein. Up to now, the application of the RARE method at field strengths of especially 3T and higher was severely limited by SAR limitations. The invention has considerably extended these limits through the invention.

In a preferred implementation of the above-described method variant, the overall SAR over the echotrain is kept low by applying TRAPS such, that a PSS0 for lower flip angles is realized in those parts of the echotrain, which encode for the outer parts of the k-space domain, which is related to the final image by two-dimensional Fourier Transformation, whereas the center parts of k-space encoded with low phase encoding gradients which encode for the image contrast—are acquired with PSS0 for high flip angles, which are associated with echoes with high signal intensity.

In a further method variant, a complete image can be produced through one single excitation and one very long echo train in that data is acquired according to the principle of the HASTE experiment wherein the signals with low phase encoding are acquired in the first few echoes and the flip angles of the refocusing pulses are subsequently transferred to a low value for reducing the radio frequency energy which permits very rapid acquisition.

One variant of the inventive method is also-particularly preferred wherein multiple modulation periods of the refocusing flip angles produce several intensity schemes which are used for reconstruction of several images with different contrasts. In this fashion, several images of different contrast can be produced in one acquisition cycle.

One further particularly preferred embodiment of the inventive method is characterized in that a further refocusing pulse with a flip angle of $90°+\alpha_n/2$ is applied after a previous pulse with flip angle an which produces almost complete refocusing of magnetization. One single RF pulse thereby produces coherent NMR signals and permits fast refocusing of the signals.

In an advantageous further development of this method variant, the almost completely refocused magnetization is transferred through application of a +90° pulse in −z magnetization or through application of a 90° pulse in +z magnetization (flip back). This produces magnetization in the vicinity of the thermal equilibrium such that after termination of an acquisition cycle, repetitive cycles with further excitations are possible with short recovery times wherein imaging becomes particularly fast, in particular when many images are acquired.

Finally, in an alternative variant of the inventive method, a multi echo sequence using TRAPS is initially carried out over the first n refocusing periods and subsequently the return to complete magnetization coherence is effected according to the principle of hyper echo formation. This method also allows reinstatement of the spins close to thermal equilibrium by use of a flipback pulse and thus repetition of the sequence with short repetition time.

Further advantages of the invention can be extracted from the description and the drawing. The features mentioned above and below can be used individually or collectively in any arbitrary combination in accordance with the invention. The embodiments shown and described are not to be understood as exhaustive enumeration but rather have exemplary character for describing the invention.

The invention is shown in the drawing and explained in more detail with reference to embodiments.

BRIEF DESCRIPTION OF THE DRAWING

The individual illustrations show:

FIG. 1a shows signal intensity I along the echo train as a function of the echo number ne in an echo train with constant refocusing flip angle of 90°;

FIG. 1b shows signal intensity I along the echo train as a function of the echo number ne in an echo train with constant refocusing flip angle of 90° over the first 20 echoes followed by 110° for ne=21–40, the dotted line representing signal intensities with 110° refocusing flip angle throughout;

FIGS. 2a–2c show the positions of the spins at the echo point in time for three isochromates with dephasing between successive refocusing pulses of $\Delta\phi=50°$, 80° and 140° respectively for a CPMG sequence with 90° refocusing flip angles;

FIG. 4a shows signal intensity I in an echo train with constant flip angle of 110°, where the spin system is in the static pseudo steady state of flip angle 110° at the first echo (dotted line). Full line represents spins starting in the pseudo steady state of flip angle 90°, which are submitted to refocusing flip angles 90° over the first 15 echoes, followed by a gradual increase to 110° in echoes ne=16–25 and constant flip angle 110° thereafter;

FIG. 4b corresponding to FIG. 4a, but for realistically, bringing spins close to the respective pseudo steady states by different preparation schemes;

FIGS. 5a and 5b diagram representing the flip angles α used in an echo train along the echo number ne (FIG. 5a), FIG. 5b representing application of such refocusing pulses to a spin system without any further preparation excitation (1) with a preparation using a 135°-pulse for the first echo (2) and with an optimized preparation of the static pseudo steady state over the first few echoes (3);

FIGS. 6a–6b correspond to FIGS. 5a–5b, but with a saw-tooth shaped modulation of refocusing flip angles;

FIGS. 9a–9b show refocusing flip angles α (FIG. 9a) and signal amplitudes generated in the corresponding echo train (FIG. 9b) for sinusoidal modulation of flip angles;

FIG. 11 shows signal intensities I along the echo number ne for a multi echo experiment wherein initially the refocusing flip angle is linearly reduced from 180° to 30° (1), 50° (2) and 90° (3) over the first 80 echoes, the final $90°+\alpha/2$ pulse produces a signal of an intensity of 90% (1), 95% (2) and 99% (3);

FIG. 12 shows signal intensities I along the echo number ne for a multi echo experiment wherein initially refocusing flip angles corresponding to those of FIG. 6b are used over the first 40 echoes, the second half of the echo train is carried out according to the principle of hyperecho formation;

DESCRIPTION OF THE PREFERRED EMBODIMENT

FIG. 1a shows exemplarily the initial signal modulations which occur during transition of the coherent transverse magnetization M(x,y) produced after an initial excitation pulse into the pseudo steady state through application of a sequence of constant refocusing pulses with a flip angle of 90°. The relaxation effects are ignored below.

These modulations change into a constant signal after a few refocusing periods. Application of a different flip angle of 110° produces further signal modulations before a new pseudo steady state appears (FIG. 1b). The signal behavior of such a pseudo steady state reached by application of constant flip angles is therefore instable with respect to changes of the refocusing pulses.

The inventive method is based on the finding that this instability is a consequence of the fact that for any pseudo steady state only the sum of all magnetizations with different dephasing each between refocusing pulses becomes constant while spins which are characterized by certain dephasing between two refocusing pulses (so-called isochromates) carry out a periodic motion.

Figure 2A:
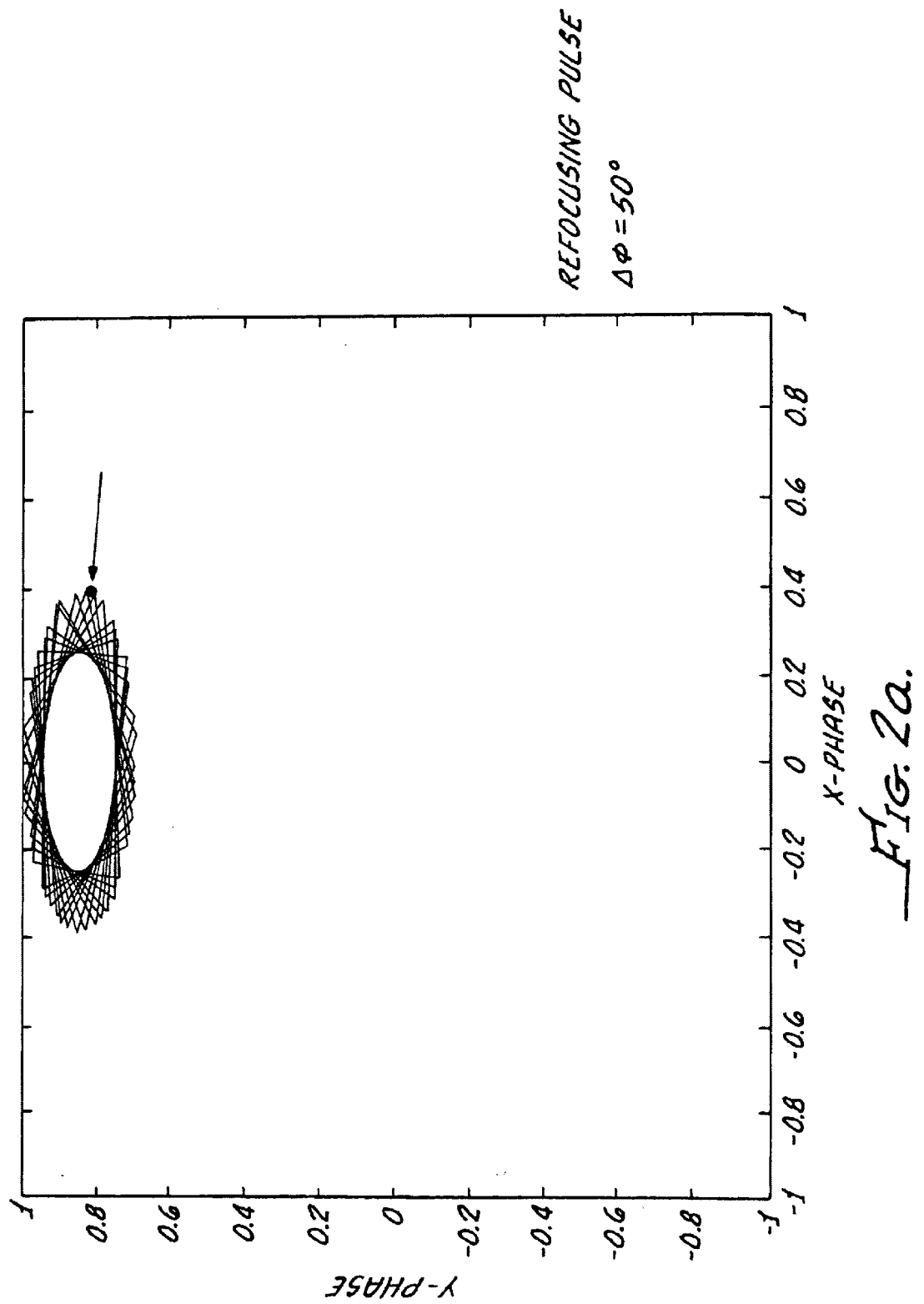
Figure 2B:
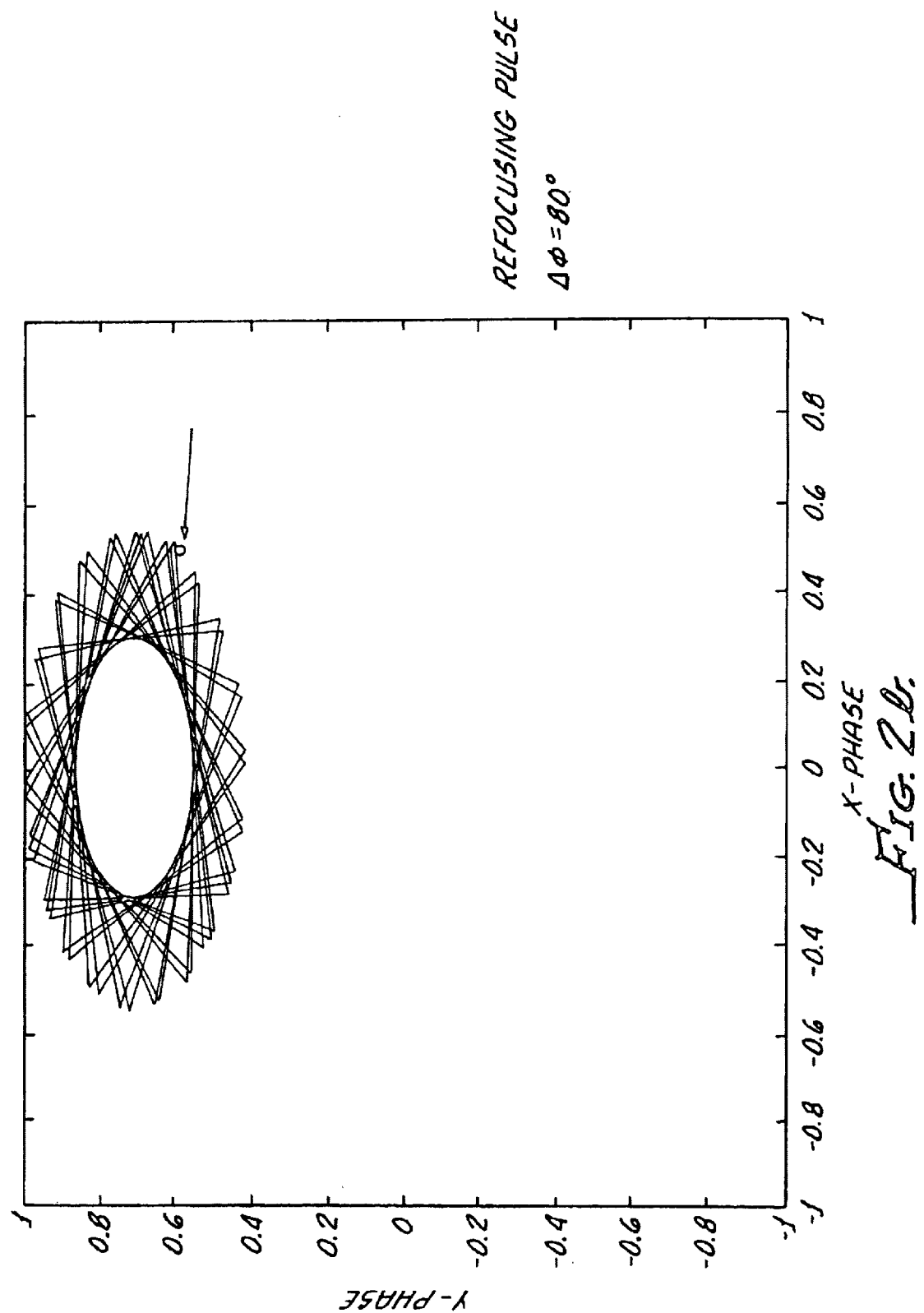

This is shown in FIG. 2. Therein, the positions of the spins at the echo point in time for three isochromates are shown for a CPMG sequence with 90° refocusing flip angles. A comparison between FIGS. 1a and 2 shows that the constant amplitude which forms in later echoes is produced merely by the incoherent superposition of the still periodic motion of the spins.

This finding explains the repeatedly occurring modulations in FIG. 1b since after change of the refocusing flip angle some echo periods are required again to transfer the isochromates in their periodic motion on other trajectories, which correspond to the new flip angle, to a new pseudo steady state.

The exact amplitude of the modulations results from the superposition of the trajectories of all isochromates involved in the echo formation. In terms of quality, it is clear that the modulations must be stronger for larger average amplitudes of the periodic motion of the individual trajectories.

In practice, the fact that the pseudo steady state obtained for the new refocusing flip angle generally has a smaller amplitude than the pseudo steady state which is obtained with direct application of a CPMG sequence with constant flip angle is often more serious than the occurring signal modulations (FIG. 1b).

From these considerations, it can be concluded that the modulations decrease when the average amplitude of the periodic motion of the isochromates is small and the change of the refocusing flip angle is also small.

Figure 3:
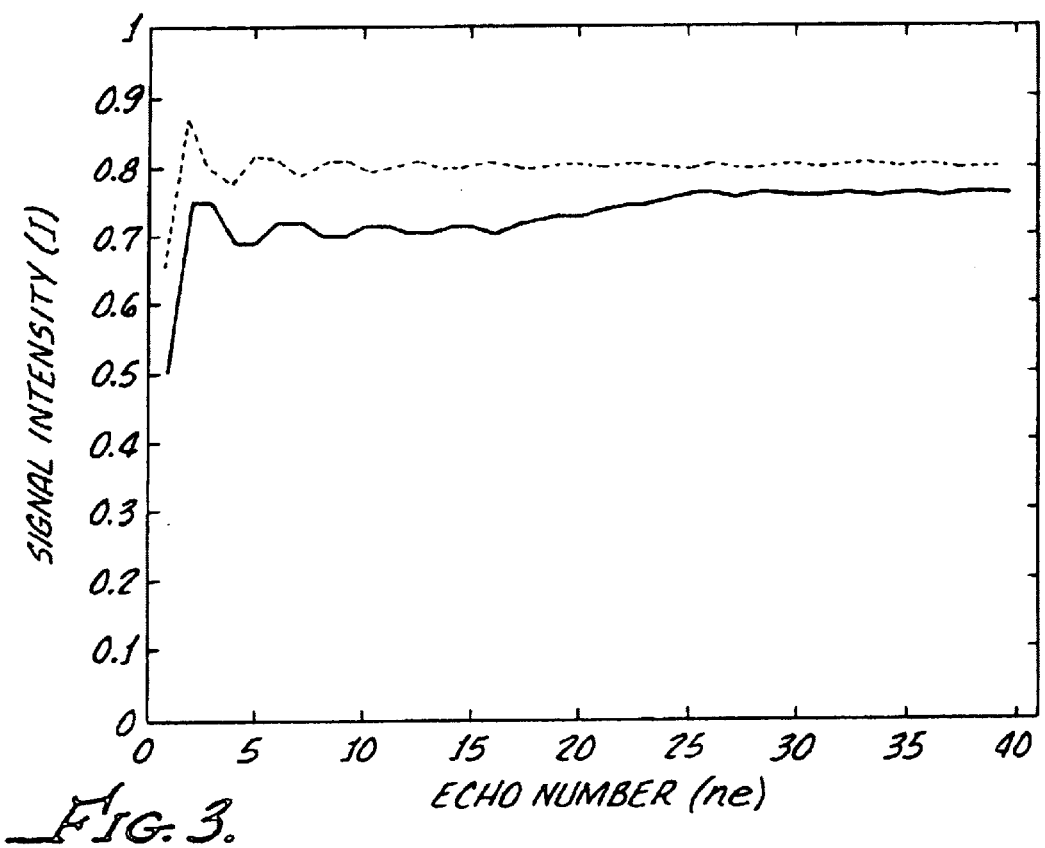
FIG. 3 shows signal intensity I along the echo train as a function of the echo number ne in an echo train with constant refocusing flip angle of 90° over the first 15 echoes and a gradual increase to 110° in echoes ne=16–25.

FIG. 3 shows that in a gradual transition of the refocusing flip angle, the signal modulations can be largely avoided, however, it is also shown that the amplitude obtained still remains clearly below the value which could be obtained with continuous application of the target flip angle.

This lack can be overcome through further observation of the pseudo steady state. In particular from literature [4–6] it is known that among the infinite number of pseudo steady states, there is one single static pseudo steady state PSS0 for one certain refocusing flip angle wherein all isochromates return to their respective position at the echo time.

For this static pseudo steady state—formally seen—the amplitude of the periodic motion of all individual trajectories is zero. During change from such a static pseudo steady state to another, no signal modulations occur and it is even more important that the signal amplitude corresponds to the new static pseudo steady state PSS0 of the new refocusing flip as shown in FIG. 4.

A comparison between FIG. 1b, FIG. 3 and FIG. 4 shows the drastic improvement of the signal behavior.

In practice, a static pseudo steady state cannot be exactly obtained with a finite number of refocusing pulses, however, it is possible with a few pulses to carry out a very good approximation to PSS0 (in a good approximation already with one single pulse with flip angle 90°+α/2[4] for flip angles in the region between approximately 30° and 180°). For very large flip angles (approximately >150°) in the vicinity of 180°, the pseudo steady state obtained with constant flip angle can be regarded as good approximation to the static pseudo steady state.

Corresponding to the presented considerations, after achieving such an approximation to the static pseudo steady state it is now possible through successive change of the flip angle of the refocusing pulses, to bring the signal amplitude close to the value corresponding to the respective static pseudo steady state for the respective flip angle.

In particular, the signal amplitude can initially be kept small through selection of small flip angles to obtain higher intensities in a later echo through transition to larger flip angles and vice versa.

FIG. 5 shows this for an initial flip angle of 30° which is firstly sinusoidally increased to 180° between the 11. to 40. echo and then symmetrically reduced to 30°. The flip angles are shown in FIG. 5a. FIG. 5b shows the resulting echo intensities. For a constant initial flip angle over the first 10 echoes, a suboptimum intensity behavior results, initiation with a first flip angle of 105° produces drastic improvement, an improved approximation to the static pseudo steady state over the first 5 flip angles produces further signal improvement. In particular, in the 40th echo, the maximum intensity of 2,3 associated with the flip angle of 180° there is achieved with a very good approximation.

FIG. 6 shows that already a linear change of the flip angles produces a very good result in practice, although the abrupt change after return to 30° in the 70th echo produces slight oscillations in the subsequent intensities.

The deviation ΔI of the observed signal intensity from the maximum possible signal associated with the respective flip angle depends—as clearly shown in FIGS. 1 through 3—on the speed of the change of the flip angle.

Figure 7A:
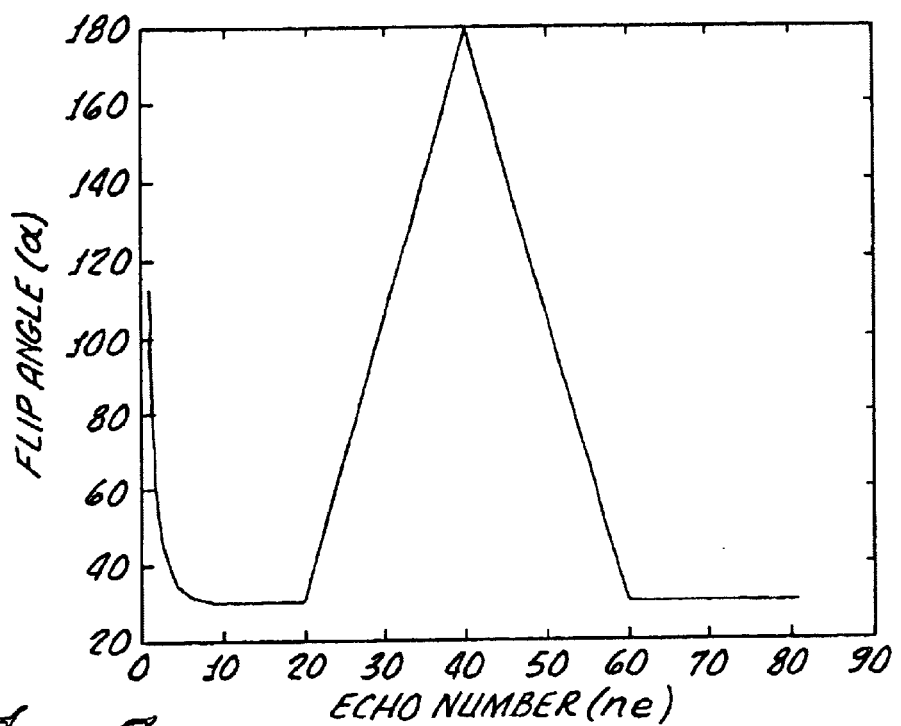
FIGS. 7a–7b correspond to FIGS. 6a–6b, but with a steeper saw-tooth shaped modulation of flip angles, the flip angels shown in FIG. 7a representing the initialization into the static pseudo steady state leading to echo amplitudes (3) in FIG. 7b.
Figure 7B:
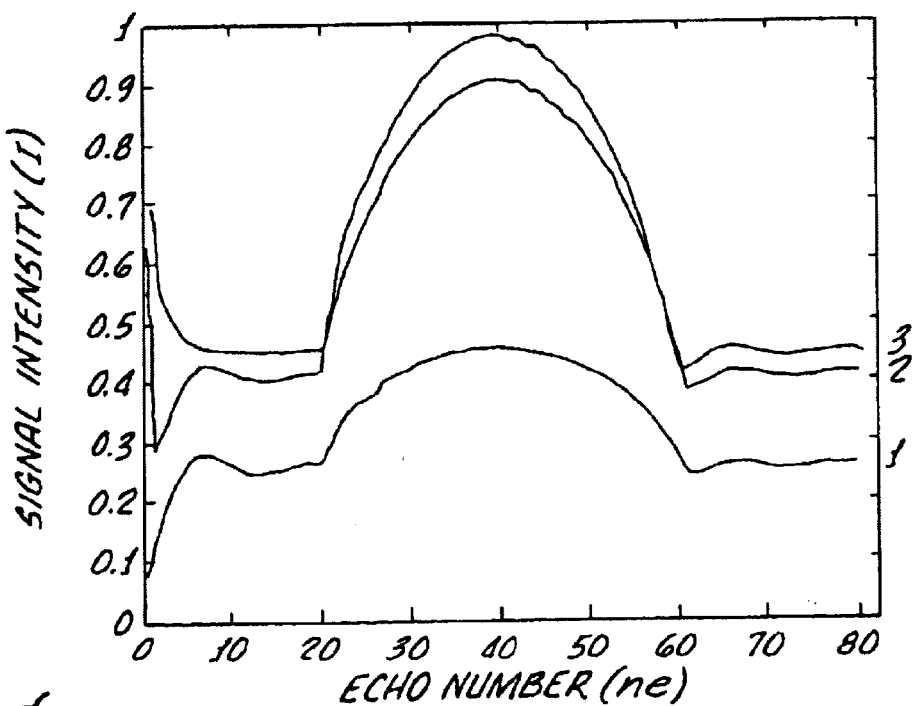

A comparison between FIGS. 6 and 7 shows that also a steeper transition of the flip angles still shows a very good intensity behavior. ΔI depends not only on the magnitude of the jump but also on the explicit initial and final values.

Figure 8:
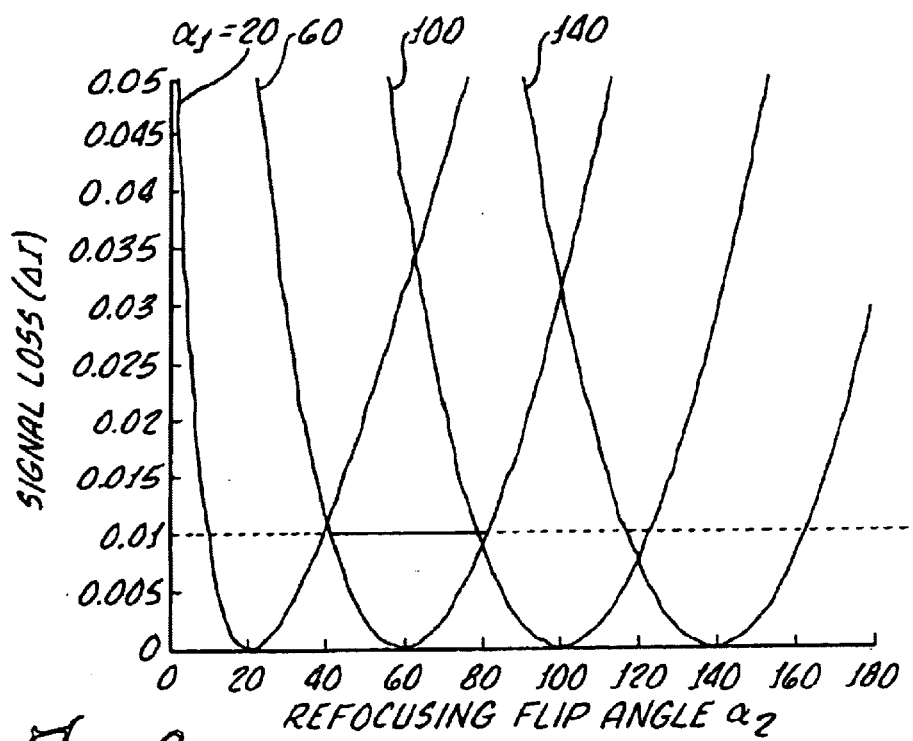
FIG. 8 shows the result of an experiment, where spins are prepared into the static pseudo steady state with respect to some flip angle α1 and then submitted to an echo train with constant refocusing flip angle αa2, α1 represents the relative signal loss with respect to the maximum possible signal amplitude given by the static pseudo steady state amplitude with respect to α2.

FIG. 8 shows ΔI for different jumps from an initial flip angle α1 to an end flip angle α2. In particular, it is shown that ΔI is smaller than 1% over a wide region of α1 and α2 as long as the amount of the flip angle difference |α1−α2| is smaller than 20°. For larger flip angle differences ΔI grows rapidly and non-linear. Due to this non-linear signal behavior, assessment of the total loss through addition of errors of discrete jumps is only approximately correct and is therefore to be regarded only as an indicator for planning the flip angles to be used for a certain implementation.

However, it can be concluded that the error in a transition from α1 to α2 in several steps is always smaller than the error with direct transition according to FIG. 8.

For the practical implementation, one can therefore assume that—as shown in FIGS. 4 through 7—good results can be obtained with the use of a step height Δα between subsequent pulses of Δα<20°.

FIG. 9 shows that continuous transition from low to high signal Intensities can be realized also through corresponding multiple increase and reduction of the flip angles without further signal loss. FIG. 10 illustrates applications wherein the flip angle of an initially high value is monotonically reduced.

Figure 10A:
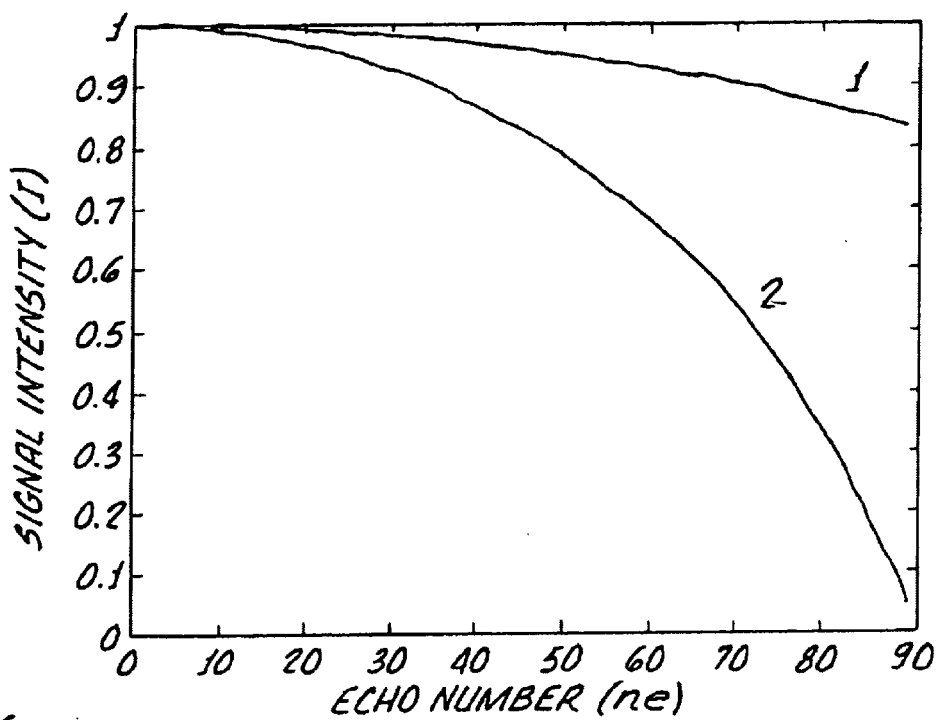
FIG. 10a shows signal intensity I along the echo number ne of a multi echo experiment with initial refocusing flip angle 180° which is reduced linearly to 90° (1) or 0° (2) over 90 echoes.

FIG. 10a shows the signal behavior of linear transition from 180° to 90° (1) and from 180° to 0° (2). In the first case, the SAR is reduced to 58%, in the second case even to 33%.

Figure 10B:
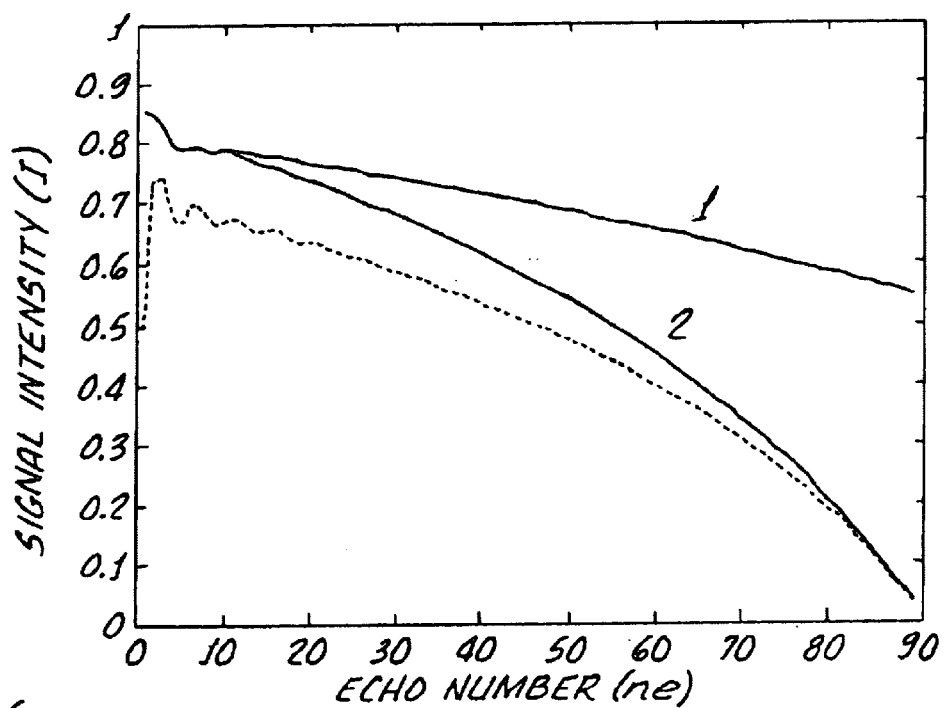
FIG. 10b shows signal intensity I along the echo number ne with initial refocusing flip angle 90° which is reduced linearly to 45° (1) or 0° (2) over 90 echoes with initial flip angles (139.5°, 107.5°, 99°, 94°, 92°, 91°, 90° . . . ) corresponding to FIG. 4b. The dotted line shows the signal intensities without the initial preparation in the static pseudo steady state.

Further reductions are possible when the initial flip angle is also reduced. FIG. 10b shows the corresponding signal behaviors with reduction of initially 90° to 45° (1) and from 90° to 0° (2) wherein the first five refocusing pulses were selected corresponding to the statements made in FIG. 4 for improved approximation to a static pseudo steady state (α=139.5, 107.5, 99, 94, 92, 91, 90 . . . ). Here, the radio frequency output is 13% (1) or 8% (2) i.e. a reduction by approximately a factor 10 with only little signal loss in the initial echoes.

For the curves shown in FIG. 10a, no special initial preparation is required since the static pseudo steady state is obtained directly and exactly for the initial 180° pulse.

Finally it should be noted that it is also possible to reproduce high signal intensity under special general conditions also with Δα>20°. One possibility, which is suited in particular after reduction of the signal intensity after application of one of the implementations shown exemplarily in FIGS. 4 through 7, for rapid reproduction of the signal, results from the previously mentioned finding that the full signal intensity can be regarded formally as static pseudo steady state to the flip angle 180° and the fact that the distribution of magnetizations in the static pseudo steady state according to reference [4] is characterized in that at the time of the refocusing pulses, all isochromates appear tilted about α/2 in a plane formed from the z axis and the direction of the B1 field of the refocusing pulses which corresponds to a tilt of about 90°+α/2 relative to the transverse plane [4].

This shows that the application of a 90°+α/2 pulse returns the magnetizations from the static pseudo steady state completely to the transverse plane and forms a signal with an intensity of almost 100%. This corresponds formally to a two-stepped linear transition from α to 180° through the average value α+(180°−α)/2=90°+α/2.

FIG. 11 shows that magnetization which was transferred through one of the measures known from literature or also through gradual transition according to the principles described herein into or close to the static pseudo steady state, is (almost) completely refocused. FIG. 11 shows initially a linear transition of the refocusing flip angles from 180° to α=30° (1), 50° (2) and 90° (3) over the first 80 echoes, the subsequent 90°+α/2 pulse forms a signal of an intensity of 90% (1), 95% (2) and 99% (3).

All these methods are designated—as mentioned above—as TRAPS (transition between pseudo steady state) methods.

TRAPS is particularly advantageously applied in nuclear magnetic tomographic imaging in the multi echo method according to the principle of the RARE sequence. It is known that the contrast and the signal-to-noise ratio (SNR) of an image recorded according to this method is determined substantially by the intensity of those echoes which have a small phase encoding corresponding to the signals in the center of the k-space. If TRAPS is applied such that for these signals the maximum signal intensity is obtained (or approached) the corresponding images will produce an almost identical SNR compared to the data acquisition with a continuously constant flip angle of 180° wherein the TRAPS acquisition requires only a fraction of the radio frequency output due to the largely low flip angles thereby drastically reducing the radio frequency absorption (SAR) of the patient.

Implementation with the flip angles used in FIG. 5 requires only 33% of the RF output. The linear change of the flip angles corresponding to FIG. 6 corresponds to 30% of the output of the comparative experiment with 180° flip angles. Mainly for application with field strengths of 1.5 T and in particular with even higher fields, TRAPS permits rapid acquisition of images which, in a conventional application, would exceed the SAR tolerable and admissible for the patient.

Practical implementation, wherein the signals are brought to a maximum high value corresponding to FIG. 9 more than once is given through the so-called multi contrast sequences with view sharing. With this approach, a small part of the data matrix in the center of the k space is recorded several times and at different echo times. The missing parts of the k space data which are required for Image reconstruction are acquired only once and combined with the respective data for image reconstruction of several images.

The possibility shown in FIG. 11 of fast return to an (almost) complete restoration of the signal coherence can be used particularly advantageously when the magnetization generated in this fashion is returned through a pulse with flip angle −90° like a flip back experiment into z magnetization which is then very close to the thermal balanced value such that rapid repetition of the acquisition is possible without considerable signal saturation [9].

Complementary thereto, the almost coherent magnetization can be displaced in the −z direction through application of a pulse with flip angle 90° which corresponds to a signal inversion and therefore can be used for acquisition of images with corresponding T1 contrast.

Compared with the recently published hyper echo method [8] which also permits reduction of the SAR without signal loss and wherein return to complete signal amplitude is generated through utilization of symmetry properties of the spin echo formation, TRAPS differs formally in that in contrast to hyper echo formation, the phase of the refocussing pulses can be selected to be continuous corresponding to the CPMG condition. TRAPS does not require any intermediary 180° pulse for return to full signal amplitude.

In contrast thereto, the hyper echo mechanism is not subject to any limitation with respect to the difference of consecutive flip angles and can be applied also for very fast amplitude variations.

For application in RARE sequences, TRAPS and hyper echo methods are therefore to be regarded as complementary: hyper echoes are advantageous when rapid change of the flip angles is desired, in practice this is the case for multi echo sequences with echo train lengths of up to approximately 15–20. For longer echo trains wherein gradual change of the signal intensities is desired, implementation of TRAPS is advantageous.

The principle of hyper echo formation can be applied also to TRAPS sequences. FIG. 12 shows an example wherein the flip angles are applied initially for the first 40 refocussing periods corresponding to the values shown for FIG. 6b(3).

After the 180° pulse which is applied before the 40th echo, the pulses in the following echo periods are selected in accordance with the principle of hyper echo formation, i.e. the pulse phases are inverted and the flip angles are used in a sequence reversed in time. The behavior of the signal intensities is very similar to the values of FIG. 6b over long distances which are shown herein again with broken lines. However, in hyper echo formation, a completely refocused signal is formed at the end of the echo train which can again be transferred into z magnetization through flip back pulses.

The prior art and the current invention show some similarity in, that both procedures set out to restore a spin echo with fully refocused magnetization after multiple spin echoes where several pulses with low refocusing flip angles have been used. In this respect both procedures set out to achieve similar goals but by very different means.

Figure 13:
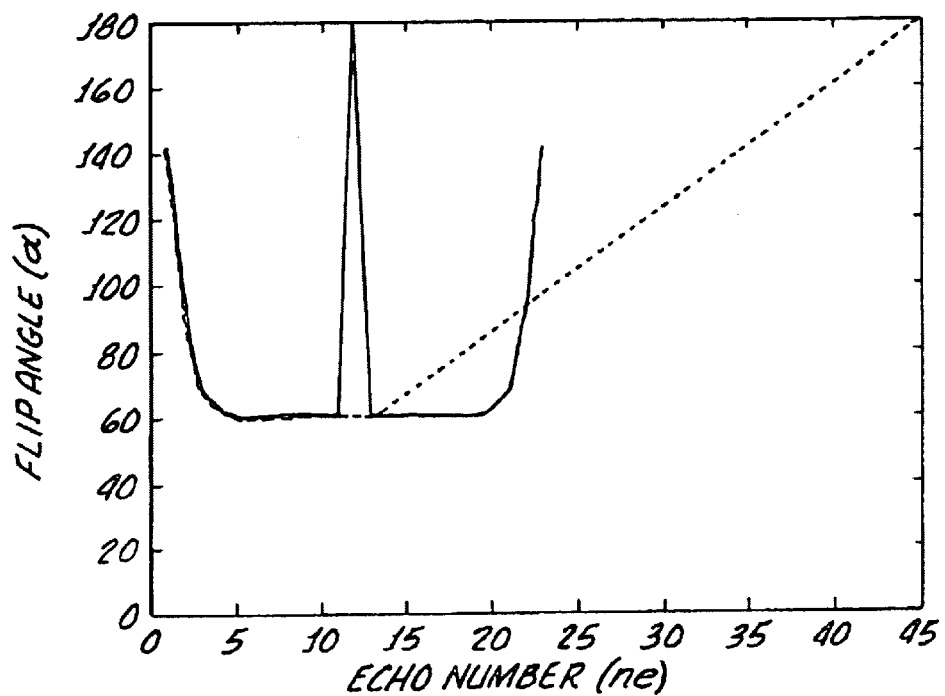
FIGS. 13–14 compare flip angle (α) and signal intensity as a function of echo number (ne) for a prior art hyperecho experiment and an experiment in accordance with the present invention.
Figure 14:
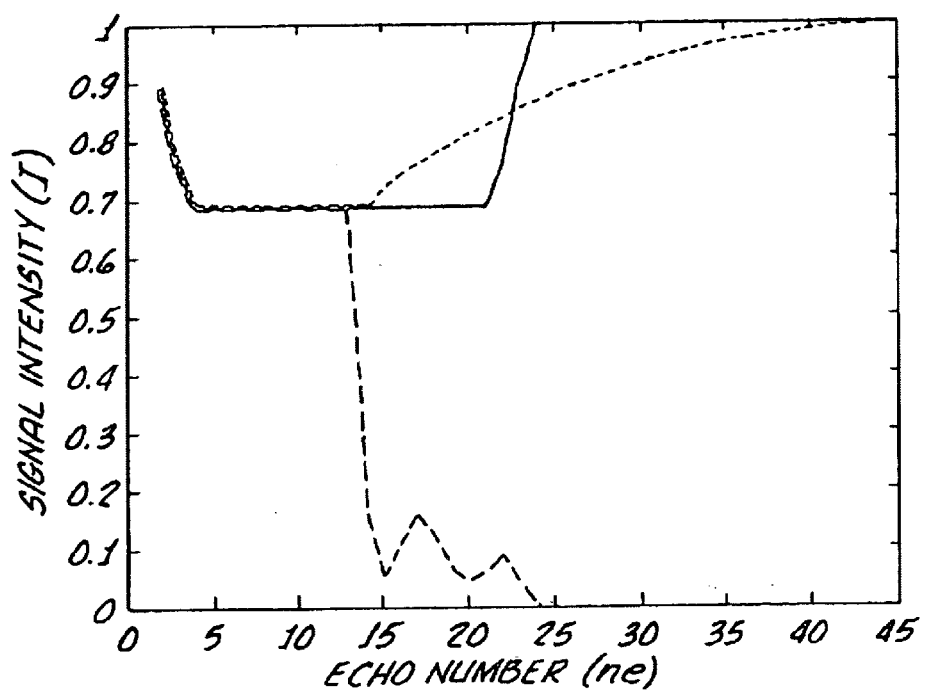

This is illustrated in FIGS. 13–14.

FIG. 13 shows flip angles a along the echo train with echo numbers ne for a hyperecho experiment (solid line) and for an experiment according to the current invention (dotted line). The hyperecho experiment is characterized by the central 180 degree pulse at ne=12, flip angles are symmetrical around this pulse. (Pulse phases are not shown, but after pulse 12 the pulses in the hyperecho sequence will be inverted with respect to the first 12 pulses and also with respect to the sequence according to the new invention ('TRAPS'), which is shown in dotted line). For the sequence according to the new invention a linearly increasing flip angle has been used.

The signal intensities I vs. ne in FIG. 14 show, that for both sequences the full echo amplitude is achieved after the $23^{rd}$ (hyperecho) and $45^{th}$ echo (TRAPS). It also shows, that both sequences are similar in the sense, that they use identical flip angles over the first 11 pulses to prepare the static pseudosteady state PSS0 (and this similarity is noted and conceded in the application), but there the similarity ends.

FIG. 14 illustrates, that TRAPS does not simply follow from hyperechoes:

If the central 180O-pulse is left out, signal intensities in a hyperecho experiment will take a totally useless course (dashed line). It should thus be noted, that the omission of the 180 degree-pulse is far from being a trivial matter. As shown in FIG. 14 it changes the signal course dramatically.

Likewise, if the phase of the pulses is not inverted in a hyperecho experiment, again a nearly identical and totally useless signal behavior will result (solid line). This illustrates the stringent necessity to maintain all three conditions (180 degree-pulse, symmetry of flip angles, and antisymmetry of pulse phases) necessitated by the hyperecho mechanism. It should be noted (and further illustrates the fundamental difference in the signal formation mechanism), that this requirement is not always and not necessarily a disadvantage of hyperechoes.

Figure 15:
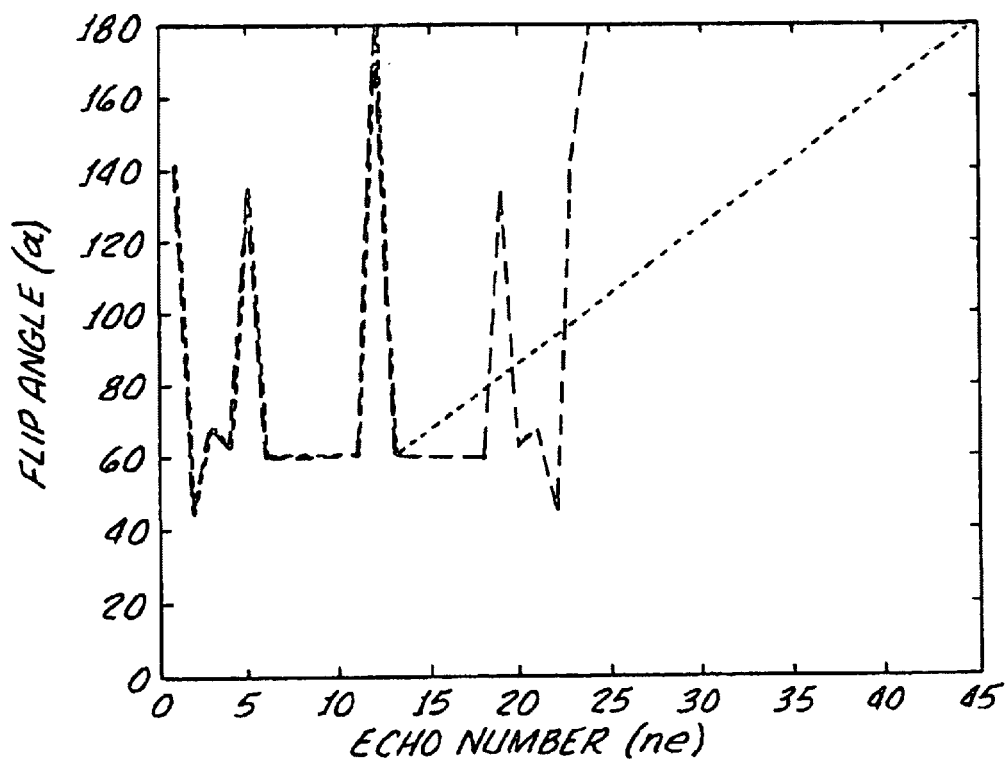
FIGS. 15–16 compare the flip angle and signal intensity of a hyperecho sequence (dashed line) with a linear change in flip angle (dotted line) after the same initial sequence.
Figure 16:
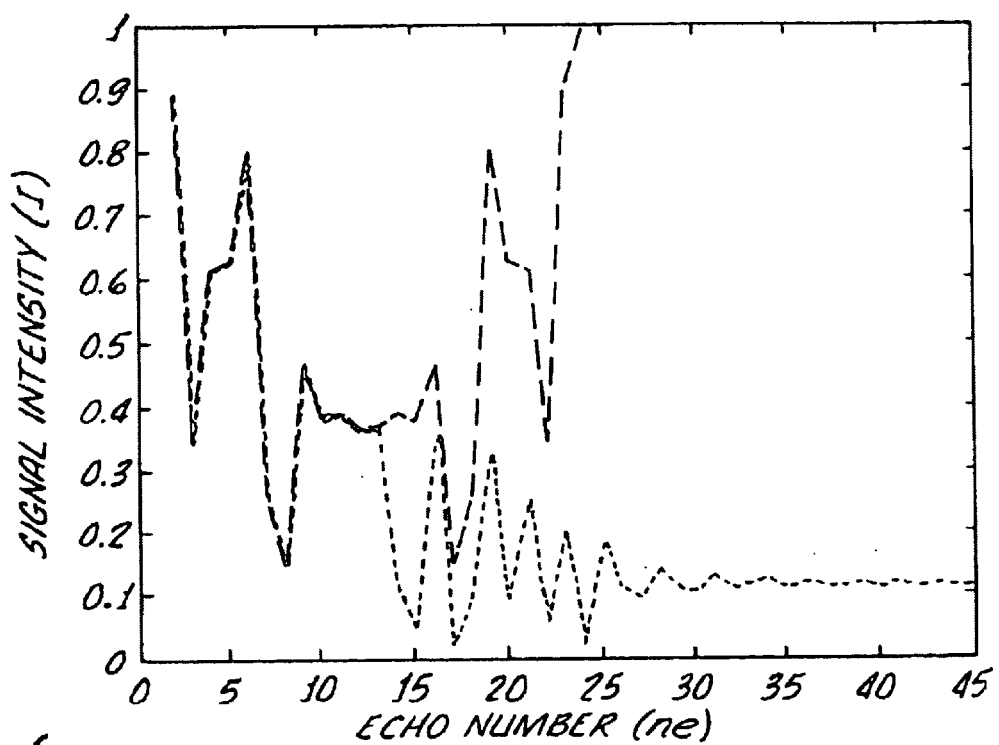

As shown in FIGS. 15–16, some other combination of flip angles will still lead to full signal recovery, when submitted to a hyperecho sequence (solid line), whereas a linear change in flip angle (dotted line) after the same initial sequence will lead to a totally different and unfavorable signal behavior.

FIG. 13-16 illustrate and emphasize the fundamental differences between the two ways of signal preparation: if a PSS0 is prepared, TRAPS will give more flexibility and the possibility to use asymmetric sequences of refocusing pulses in order to reach the full signal amplitude. For a more general case, the hyperecho mechanism will still allow retrieval of the full amplitude, whereas TRAPS will fail. Accordingly, both sequences are fundamentally different in nature.

LIST OF REFERENCES

[1] Hahn E L, Spin Echoes, Phys. Rev. 80:580–594 (1950)
[2] Meiboom S, Gill D, Modified Spin-Echo Method for Measuring Nuclear Relaxation Times, Review of Scientific Instruments, 29:688–691 (1958)
[3] Hennig J, Multiecho Imaging Sequences with Low Refocusing Flip Angles, J. Magn. Reson., 78:397–407 (1988)
[4] Hennig J. Scheffler K, Easy improvement of signal-to-noise in RARE-sequences with low refocusing flip angles, Magnet Reson Med 44(6):983–985 (2000)
[5] Le Roux P, Hinks R S, Stabilization of echo amplitudes in FSE sequences, Magn Reson Med. 30:183–90 (1993)
[6] Alsop D C, The sensitivity of low flip angle RARE imaging, Magn Reson Med. 37:176–84 (1997)
[7] Hennig J. Echoes—How to Generate, Recognize, Use or Avoid Them in MR-Imaging Sequences. Conc. Magn. Reson. 1991; 3: 125–143.
[8] Hennig J. Scheffler K, Hyperechoes, Magnet Reson Med 46(1):6–12
[9] van Uijen C M, den Boef J H, Driven-equilibrium radiofrequency pulses in NMR imaging, Magn Reson Med. December 1984; 1(4):502–7.

I claim:

1. A transient pseudo steady state (TRAPS) nuclear magnetic resonance (NMR) spectroscopy or tomography method, wherein a sequence of radio frequency (RF) pulses is applied onto a spin ensemble in a multi-echo experiment, and wherein the magnetization generated after an initial excitation pulse is transferred to substantially the static pseudo steady state with respect to some flip angle $\alpha 1$, the method comprising:

transferring magnetization through gradual increasing change of the refocusing flip angle $\alpha n (\alpha 1 < \alpha n < 180$ degrees) in subsequent refocusing intervals following the initial pulse sequence to arrive at substantially the static pseudo steady state of the respectively used refocusing pulses with refocusing flip angles $\alpha n (\alpha 1 < \alpha n < 180$ degrees) such that the echo amplitude of the nth echo generated in this fashion is substantially a maximum possible value corresponding to the respective refocusing pulse with refocusing flip angle an in the static pseudo state magnetization with respect to refocusing flip angle $\alpha n$.

2. Method according to claim 1, further comprising applying the multi echo sequence through the use of corresponding temporally changed magnetic fields like an NMR imaging method according to the RARE method.

3. Method according to claim 2, further comprising phase encoding of the individual echoes such that the signals with low phase encoding are associated with echoes with high signal intensity.

4. Method according to claim 2, further comprising acquiring data according to the HASTE experiment principle, wherein the signals with low phase encoding are acquired in the first few echoes and the flip angles of the refocusing pulses are subsequently transferred to a low value for reducing the radio frequency energy.

5. Method according to claim 1 further comprising multiple modulation periods of the refocusing flip angle, wherein several intensity maxima are generated and applied in the reconstruction of several images with different contrasts.

6. Method according to claim 1, further comprising applying a further refocusing pulse to a series of pulses with a flip angle of 90 degrees $+\alpha_n/2$ with respect to the previous pulse, such that the magnetization is almost completely refocused.

7. Method according to claim 6, further comprising transferring the almost completely refocused magnetization either into −z magnetization through application of an additional +90° pulse or into +z magnetization through application of an additional −90° pulse.

8. Method according to claim 1, further comprising a TRAPS multi echo sequence initially carried out over the first n refocusing periods of a pulse sequence and subsequently, returning to a complete magnetization coherence and producing a hyperecho.

9. A method according to any one of claims 1–8, further comprising a multi-echo experiment in which after reaching a signal maximum with a sequence of increasing refocusing flip angles, further refocusing flip angles with $\alpha_n<180$ degrees are applied in order to arrive at substantially the static pseudo steady state of the respectively used refocusing pulses with refocusing flip angles $\alpha_n<180$ degrees.

* * * * *